United States Patent
Hjertaas

(10) Patent No.: US 9,692,227 B2
(45) Date of Patent: Jun. 27, 2017

(54) DC SUPPLY UNIT FOR A POWER PROVISION UNIT

(71) Applicant: ABB Schweiz AG, Baden (CH)

(72) Inventor: Morten Hjertaas, Oslo (NO)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 14/470,136

(22) Filed: Aug. 27, 2014

(65) Prior Publication Data

US 2014/0362483 A1   Dec. 11, 2014

Related U.S. Application Data

(63) Continuation of application No. PCT/EP2013/053813, filed on Feb. 26, 2013.

(30) Foreign Application Priority Data

Feb. 29, 2012  (EP) .................................. 12157480

(51) Int. Cl.
*H02H 3/18* (2006.01)
*H02H 3/20* (2006.01)
(Continued)

(52) U.S. Cl.
CPC ................ *H02H 3/18* (2013.01); *H02H 3/20* (2013.01); *H02H 7/268* (2013.01); *H01L 23/62* (2013.01); *H02J 7/0029* (2013.01)

(58) Field of Classification Search
CPC . H02H 3/18; H02H 7/268; H02H 3/20; H01L 23/62; H02J 7/0029
(Continued)

(56) References Cited

U.S. PATENT DOCUMENTS

| 5,726,505 A | 3/1998 | Yamada et al. |
| 2003/0160286 A1 | 8/2003 | Reischer et al. |

(Continued)

FOREIGN PATENT DOCUMENTS

| CN | 2836340 Y | 11/2006 |
| CN | 201113418 Y | 9/2008 |

(Continued)

OTHER PUBLICATIONS

European Search Report Application No. EP 12 15 7480 Completed: Oct. 2, 2012 4 pages.
(Continued)

*Primary Examiner* — Zeev V Kitov
(74) *Attorney, Agent, or Firm* — Whitmyer IP Group LLC

(57) ABSTRACT

A DC supply unit includes a first current blocking device arranged to allow current to flow in a first direction through the first current blocking device, and to block current that flows in a second direction opposite the first direction. In this context, the first direction is the flow direction of current during normal operation of the DC supply network. The DC supply unit further includes a first switching unit arranged in anti-parallel connection with the first current blocking device, wherein the first switching unit is controllable in its on-state to selectively allow reverse current during normal operation of the DC supply network to flow through the first switching unit in the second direction so as to bypass the first current blocking device and in an off-state to block current in the second direction when a fault occurs in the DC supply network.

16 Claims, 3 Drawing Sheets

(51) Int. Cl.
    *H02H 7/26*     (2006.01)
    *H02J 7/00*     (2006.01)
    *H01L 23/62*     (2006.01)

(58) Field of Classification Search
    USPC .......................................................... 361/63
    See application file for complete search history.

(56) References Cited

U.S. PATENT DOCUMENTS

| | | |
|---|---|---|
| 2003/0183838 A1 | 10/2003 | Huang et al. |
| 2006/0261751 A1* | 11/2006 | Okabe et al. ................. 315/291 |
| 2007/0194744 A1 | 8/2007 | Chuah et al. |
| 2009/0218967 A1 | 9/2009 | McLean et al. |
| 2009/0322161 A1* | 12/2009 | Patel ............................ 307/131 |
| 2012/0043816 A1 | 2/2012 | Pereira |

FOREIGN PATENT DOCUMENTS

| | | |
|---|---|---|
| CN | 201898438 U | 7/2011 |
| DE | 102006049715 A1 | 5/2008 |
| DE | 102008056864 A1 | 5/2010 |
| WO | 2011141053 A1 | 11/2011 |

OTHER PUBLICATIONS

International Search Report and Written Opinion of the International Searching Authority Application No. PCT/EP2013/053813 Completed: May 6, 2013; Mailing Date: May 17, 2013 8 pages.

* cited by examiner

DC SUPPLY UNIT FOR A POWER PROVISION UNIT

CROSS-REFERENCE TO RELATED APPLICATIONS

This application is a continuation of International Application No. PCT/EP2013/053813, filed Feb. 26, 2013, which claims priority of European Patent Application No. 12157480.0 filed Feb. 29, 2012. All prior applications are herein incorporated by reference.

FIELD OF THE INVENTION

The present disclosure generally relates to power systems and in particular to a DC supply unit for a power provision unit used in a DC supply network environment.

BACKGROUND OF THE INVENTION

Power systems typically comprise a plurality of components, such as one or more power generation source, drives and energy storage modules. These components are typically interconnected by means of a busbar system in which currents can flow for providing power to one or more loads connected to the power system.

At some point a fault, such as a short circuit will inevitably occur in the power system, either in the busbar system, in one of the components of the system, or in a load. In case of a fault, it is important to isolate the fault from the healthy part of the system such that normal power provision can be continued by means of the healthy part, and for protecting the healthy parts from being damaged. For this purpose, a protection system is typically included in the power system.

A protection system arranged to handle faults in a power system typically comprises monitoring equipment arranged to monitor electrical parameters such as currents in the power system, and circuit breakers controlled by the monitoring equipment. The circuit breakers are arranged in such a way in the power system that selective fault isolation can be obtained in case of a fault.

Existing protection systems can in some applications however be both very expensive and space consuming.

SUMMARY OF THE INVENTION

Direct current (DC) circuit breakers are particularly large, because unlike alternating current circuit (AC) breakers, they cannot depend on zero crossings. Therefore, larger air gaps are needed for DC circuit breakers to ensure proper protection. As a result, DC circuit breakers typically consume large amounts of space, and they are expensive to manufacture.

In view of the above considerations, a general object of the present disclosure is to provide a DC supply unit that enables the creation of a circuit breaker less DC supply network that selectively can handle faults.

Hence, according to a first aspect of the present disclosure there is provided a DC supply unit which at one end is arranged to be connected to a DC supply network and which at its other end is arranged to be connected to a power provision unit internal bus, wherein the DC supply unit comprises: a first current blocking device arranged to allow current to flow in a first direction through the first current blocking device, which first direction is the flow direction of current during normal operation of the DC supply network, and to block current that flows in a second direction opposite the first direction, and a first switching unit arranged in anti-parallel connection with the first current blocking device, wherein the first switching unit is controllable in its on-state to selectively allow reverse current during normal operation of the DC supply network to flow through the first switching unit in the second direction so as to bypass the first current blocking device and in an off-state to block current in the second direction when a fault occurs in the DC supply network.

By utilising one or more DC supply units according to the present disclosure, a DC supply network that selectively can handle faults without the use of circuit breakers can be created. To this end, current is able to flow through the DC supply unit during normal operation of the DC supply network such that power can be provided to the power provision unit from the DC supply network. Moreover, reverse current during normal operation is also able to flow through the DC supply unit through the first switching unit as the first switching unit is in its on-state. Furthermore, when a fault occurs in the DC supply network, the first switching unit is set in its off-state, thereby blocking current from flowing through the first switching unit, thereby preventing the power provision unit from providing currents to the fault.

A power provision unit is herein defined to be a unit that is either arranged to provide reserve power to the DC supply network, such as an energy storage unit, or a unit such as a drive unit, that is arranged to provide power to electrical motors or similar electrical equipment connected to the DC supply network.

One embodiment comprises a first conductor and a second conductor for connecting the DC supply unit to the DC supply network and to the power provision unit, wherein each of the first current blocking device and the first switching unit has a respective input terminal and output terminal connected to the second conductor.

According to one embodiment, the first current blocking device is a passive current blocking device.

According to one embodiment, the first current blocking device is a diode.

One embodiment comprises an inductor connected to the second conductor. Thereby current controlled reverse feeding may be provided during a fault, thus enabling the protection of a power provision unit comprising a battery or a super capacitor fed DC-DC chopper.

According to one embodiment, the first current blocking device is connected in parallel with the first switching unit and with the inductor in such a way that current flowing in the first direction bypasses the inductor.

One embodiment comprises a second switching unit connected in parallel with the first current blocking device.

According to one embodiment, the second switching unit is a thyristor.

One embodiment comprises a third current blocking device connected in parallel with the second switching unit, the third current blocking device being arranged to allow current to flow in the second direction through the third current blocking device, and wherein the third current blocking device is arranged to block current that flows in the first direction.

According to one embodiment, the second switching unit is arranged in parallel with the third current blocking device in such a way that current flowing in the first direction bypasses the third current blocking device.

According to one embodiment, the first switching unit comprises an insulated gate bipolar transistor.

According to one embodiment, the power provision unit is a drive unit.

According to one embodiment, the power provision unit is an energy storage unit.

According to a second aspect of the present disclosure there is provided a power provision unit comprising a DC supply unit according to the first aspect presented herein.

Generally, all terms used in the claims are to be interpreted according to their ordinary meaning in the technical field, unless explicitly defined otherwise herein. All references to "a/an/the element, apparatus, component, means, etc. are to be interpreted openly as referring to at least one instance of the element, apparatus, component, means, etc., unless explicitly stated otherwise.

BRIEF DESCRIPTION OF THE DRAWINGS

The specific embodiments of the inventive concept will now be described, by way of example, with reference to the accompanying drawings, in which.

DETAILED DESCRIPTION OF THE INVENTION

The inventive concept will now be described more fully hereinafter with reference to the accompanying drawings, in which exemplifying embodiments are shown. The inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description.

Figure 1:
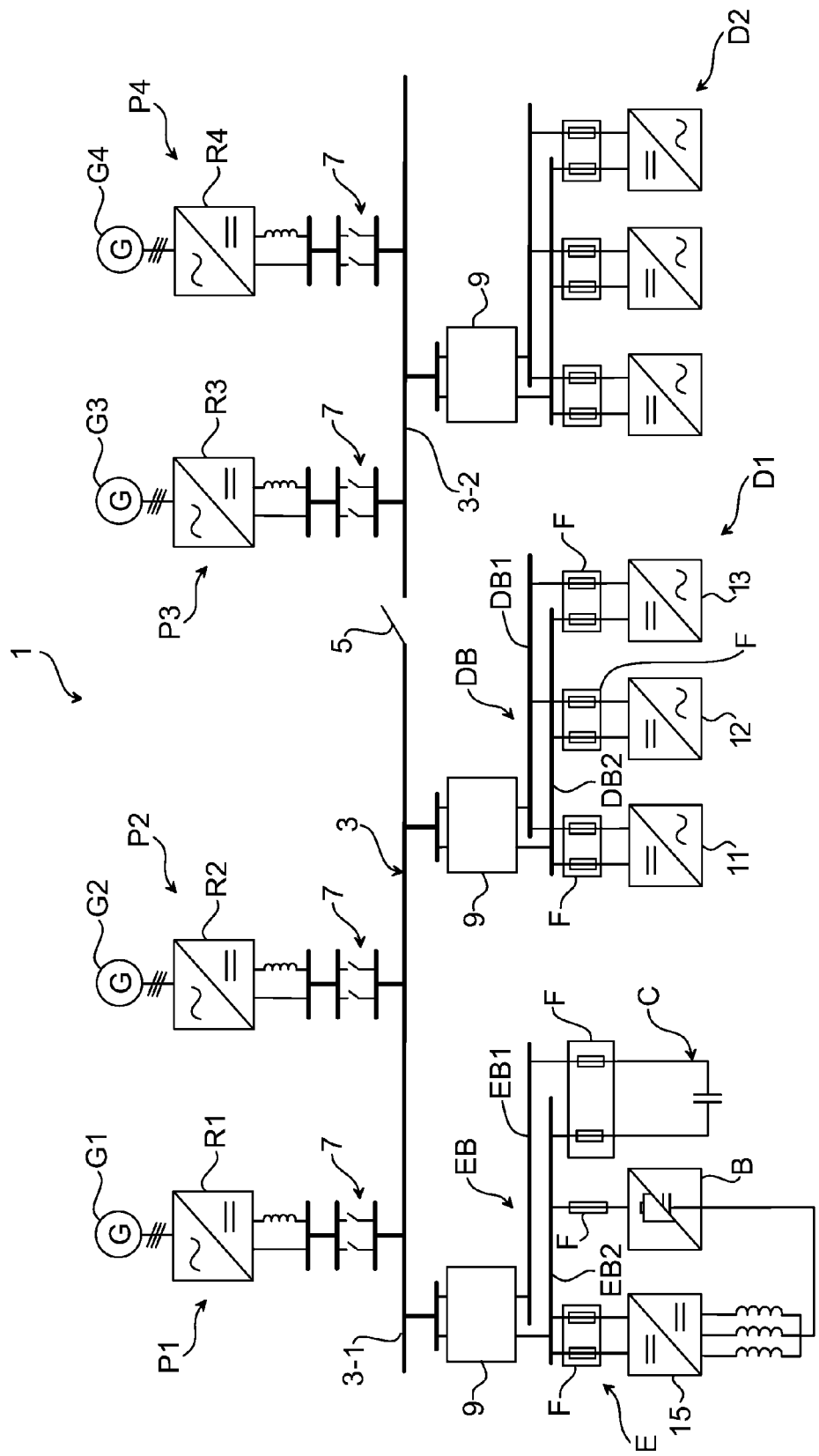
FIG. 1 is a schematic diagram of a DC supply network in which a DC supply unit may be used together with power provision units.

FIG. 1 depicts a schematic diagram of an example of a DC supply network 1 in which a DC supply unit according to this disclosure may be utilized. The DC supply network 1 comprises a main DC bus 3 having a first busbar 3-1 and a second busbar 3-2 separable by means of a bustie breaker 5, a first power generating unit P1, a second power generating unit P2, a third power generating unit P3, a fourth power generating unit P4, an energy storage unit E, a first drive unit D1, a second drive unit D2, and DC supply units 9.

The first drive unit D1 and the second drive unit D2 are arranged to power electrical motors or similar equipment. Examples of such drive units are single drives, multi drives or static frequency converters intended to supply normal AC consumers with 50 Hz or 60 Hz AC power.

The drive units D1, D2 and the energy storage unit E are examples of what in more general terms will be referred to as power provision units in this disclosure.

The DC supply network 1 further comprises isolator switches 7, i.e. disconnectors, associated with a respective power generating unit P1, P2, P3, P4 for being able to disconnect the power generating units P1, P2, P3, P4 from the main DC bus 3. Thereby each power generating unit can be isolated from a fault on e.g. the main DC bus 3, or they can be isolated for maintenance purposes.

The first power generating unit P1 is arranged to feed the main DC bus 3, and is connectable to the main DC bus 3 via an isolator switch 7. According to the example in FIG. 1, the first power generating unit P1 is connectable to the first busbar 3-1.

The second power generating unit P2 is arranged to feed the main DC bus 3, and is connectable to the main DC bus 3 via an isolator switch 7. According to the example in FIG. 1, the second power generating unit P2 is connectable to the first busbar 3-1.

The third power generating unit P3 is arranged to feed the main DC bus 3, and is connectable to the main DC bus 3 via an isolator switch 7. According to the example in FIG. 1, the third power generating unit P3 is connectable to the second busbar 3-2.

The fourth power generating unit P4 is arranged to feed the main DC bus 3, and is connectable to the main DC bus 3 via an isolator switch 7. According to the example in FIG. 1, the fourth power generating unit P1 is connectable to the second busbar 3-2.

The first power generating unit P1 comprises a generator G1, such as a diesel engine driven generator, arranged to generate alternating current, and a rectifier R1 arranged to convert the alternating current to direct current to be fed into the main DC bus 3. The rectifier R1 may be provided with fuses dimensioned to blow in case of a fault in the rectifier R1.

The second power generating unit P2, the third power generating unit P3, and the fourth power generating unit P4 may have similar design as the first power generating unit P1 or their design may be different, e.g. they may have a crow bar design together with a diode on diode on the positive pole of the rectifier DC terminal.

Each of the exemplified first drive unit D1 and the second drive unit D2 has a drive unit bus system DB comprising a first bus DB1 and a second bus DB2. Furthermore, each of the first drive unit D1 and the second drive unit D2 has a number of converter units, in the following exemplified by inverters I1, I2, I3, connected to their respective drive unit bus system DB, and fuses F arranged between the terminals of the inverters I1, I2, I3, and the drive unit bus system DB. An example of a suitable inverter is ABB's ACS800 inverter.

The exemplified energy storage unit E has an energy storage unit bus system EB having a first bus EB1 and a second bus EB2. The energy storage unit E further comprises power provision devices such as a battery unit B and a capacitor bank C connected to the energy storage unit bus system EB, a DC-DC converter 15 connected to the energy storage unit bus system EB, and fuses F. The fuses F are arranged between the terminals of the DC-DC converter 15 and the energy storage unit bus system EB, between the capacitor bank C and the energy storage unit bus system EB, and between the battery unit B and the energy storage unit bus system EB.

By means of the DC-DC converter 15 the voltage level output of the battery unit B can be controlled if power is to be provided to the main DC bus 3 from the energy storage unit E.

It is to be noted that the energy storage unit E is an example of a many possible configurations regarding the number of power provision devices and converters. For example, some variations of an energy storage unit do not have a capacitor bank, and some may be without a DC-DC converter.

Each DC supply unit 9 is at one end arranged to be connected with the main DC bus 3 and at its other end it is arranged to be connected to a power provision internal bus such as the drive unit bus system or the energy storage unit bus system. A DC supply unit 9 may form part of a power provision unit. Alternatively, a DC supply unit may be an external component which can be connected to a power provision unit.

Examples of the DC supply unit 9 will now be described with reference to FIGS. 2*a-c*.

Figure 2A:
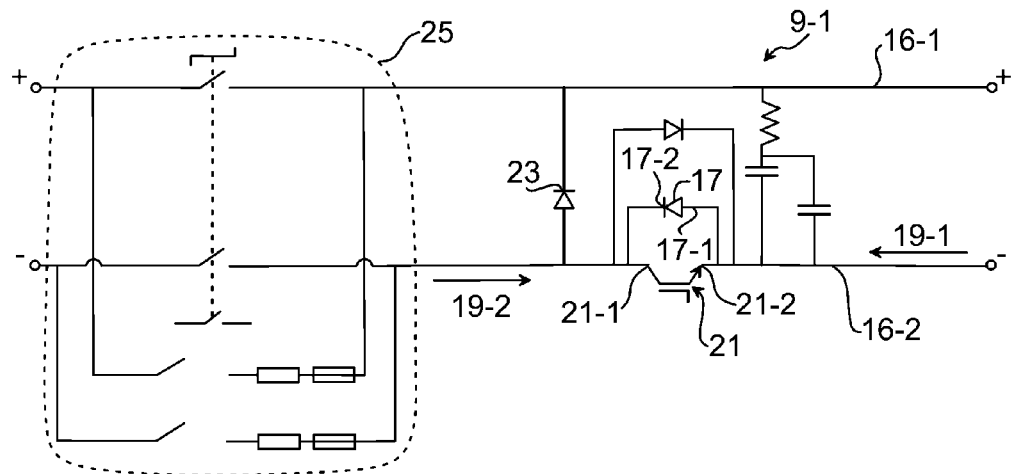
FIG. 2a is a schematic diagram of a first example of a DC supply unit.

FIG. 2*a* depicts a schematic diagram of a first example of a DC supply unit 9. DC supply unit 9-1 comprises a first conductor 16-1, a second conductor 16-2, a first current blocking device 17, and a first switching unit 21.

The first current blocking device 17 can for example be a passive current blocking device such as a diode. Furthermore, depending on the power rating of the DC supply system in which the DC supply unit 9-1 is used, further current blocking devices may be arranged in parallel with the first current blocking device, e.g. a plurality of diodes may be parallel connected to be able to handle high currents.

The first switching unit 21 may for instance comprise one or more insulated gate bipolar transistors (IGBT).

The first current blocking device 17 is arranged to allow current to flow in a first direction 19-1 through the first current blocking device 17. The first direction 19-1 is the flow direction of current during normal operation of the DC supply network to which the DC supply unit 9-1 may be connected. In this sense, normal operation is the operational state of the DC supply network when no fault is present in the DC supply network, such fault being external to the DC supply unit 9-1 and external to the drive unit to which the DC supply unit 9-1 may be connected. Typically during normal operation, the first conductor 16-1 is the plus pole and the second conductor 16-2 is the minus pole, although in some situations that may occur during normal operation, the current may be reversed for shorter periods. However, the reference first direction 19-1 shall herein mean the situation when power is provided to the power provision unit from the DC supply network and not when power is provided to the DC supply network from a load via the DC supply unit. This definition applies to all the examples disclosed herein.

The first current blocking device 17 is further arranged to block current that flows in a second direction 19-2 opposite the first direction 19-1.

The first switching unit 21 is arranged in anti-parallel connection with the first current blocking device 17. The first switching unit 21 is controllable, by means of control signals, to selectively allow current to flow through the first switching unit 21 in the second direction 19-2 so as to bypass the first current blocking device 17, and to block current in the second direction 19-2.

The first current blocking device 17 has an input terminal 17-1 and an output terminal 17-2. The first switching unit 21 has an input terminal 21-1 and output terminal 21-2. According to the example in FIG. 2*a*, the input terminal 17-1 and the output terminal 17-2 of the first current blocking device 17 are connected to the second conductor 16-2. Similarly, the input terminal 21-1 and the output terminal 21-2 of the first switching unit 21 are also connected to the second conductor 16-2.

It is to be noted that, as a variation of the first example, the input terminal and the output terminal of the first current blocking device may be connected to the first conductor and the input terminal and the output terminal of the first switching unit may also be connected to the first conductor, if the arrangement of the first current blocking device and the first switching unit is mirrored. Thus, in that case the first current blocking device is arranged to allow current flowing in the second direction 19-2 to flow through the first current blocking device and the first switching unit is then arranged such that it can be controlled to allow current flowing in the first direction 19-1 to flow through the first switching unit. The same also applies to the second and third examples disclosed herein.

Returning now to FIG. 2*a*, the DC supply unit 9-1 may further comprise a freewheeling diode 23 connected between the first conductor 16-1 and the second conductor 16-2.

Additionally, the DC supply unit 9-1 may in some variations also comprise an isolator switch unit 25, i.e. a disconnector. Thereby, the DC supply unit 9-1 and thus the power provision unit connected to the DC supply unit may be isolated from a fault on for instance the main DC bus shown in FIG. 1, or the isolator may isolate a faulty power provision unit connected to the DC supply unit 9-1.

Figure 2B:
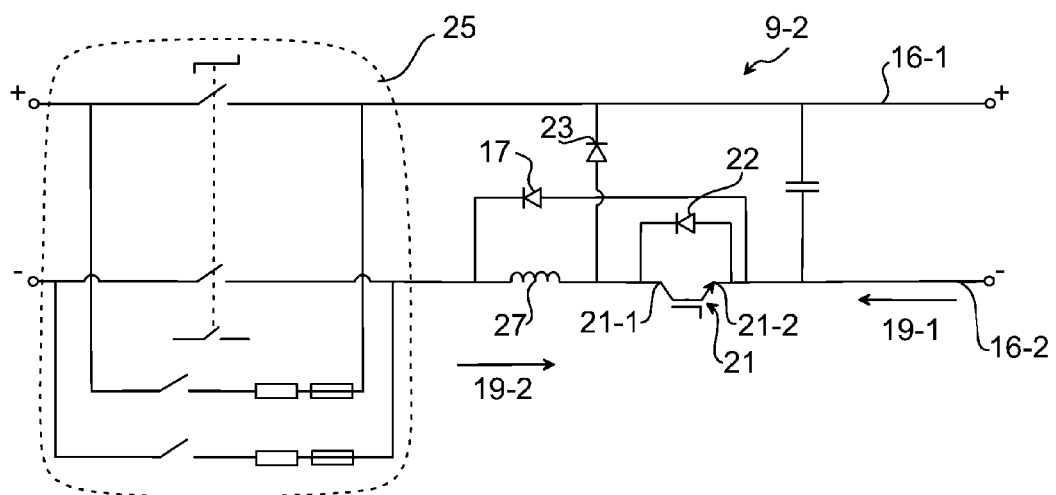
FIG. 2b is a schematic diagram of a second example of a DC supply unit.
Figure 2C:
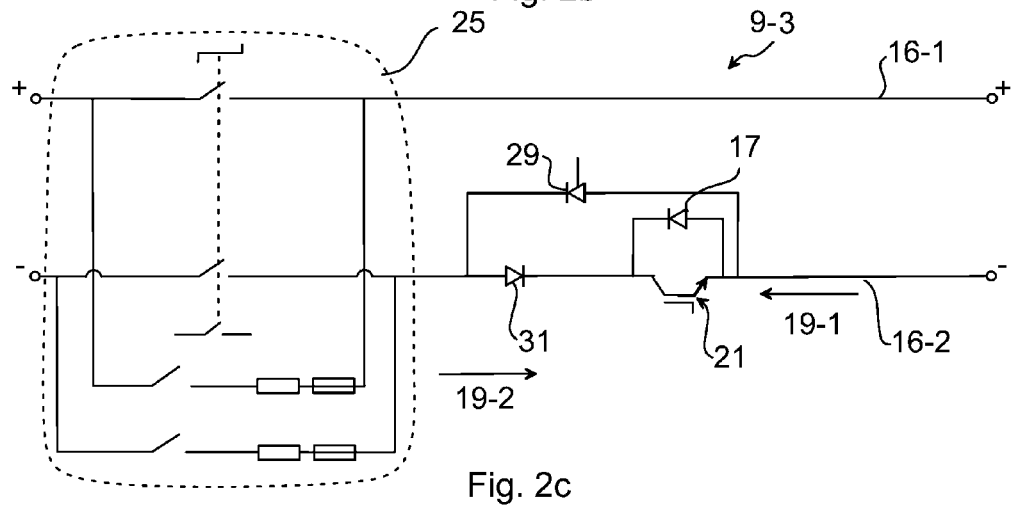
FIG. 2c is a schematic diagram of a third example of a DC supply unit.

Referring now to FIG. 2*b*, a second example of a DC supply unit will now be described. DC supply unit 9-2 comprises a first conductor 16-1, a second conductor 16-2, a first current blocking device 17, a first switching unit 21 and an inductor 27.

The first current blocking device 17 is arranged to allow current to flow in the first direction 19-1 through the first current blocking device 17. The first current blocking device 17 is further arranged to block current that flows in a second direction 19-2 opposite the first direction 19-1.

In this example, the first current blocking device 17 can for example be a passive current blocking device such as a diode. Furthermore, depending on the power rating of the DC supply system in which the DC supply unit 9-2 is used, further current blocking devices may be arranged in parallel with the first current blocking device, e.g. a plurality of diodes may be parallel connected to be able to handle higher currents. The first current blocking device 17 may be connected in anti-parallel with the first switching unit 21 and with the inductor 27 in such a way that current flowing in the first direction 19-1 bypasses the inductor 27 and the first switching unit 21.

According to one variation, DC supply unit 9-2 may comprise a second current blocking device 22. The first switching unit 21 may according to this embodiment be arranged in anti-parallel connection with the second current blocking device 22. The second current blocking device 22 can for example be a diode that is included in or forms part of the first switching unit 21.

The first switching unit 21 is controllable, by means of control signals, to selectively allow current to flow through the first switching unit 21 in the second direction 19-2 so as to bypass the first current blocking device 17 and the second current blocking device 22, and to block current in the second direction 19-2.

The first switching unit 21 may for instance be an IGBT.

The inductor 27 may have its terminals connected to the second conductor 16-2. The inductor 27 may be arranged downstream of the anti-parallel connection of the second current blocking device 22 and first switching unit 21, with respect to the first direction 19-1. In case of a mirror arrangement, when the mentioned components are connected to the first conductor, the inductor is upstream of the anti-parallel connection of the second current blocking device 22 and first switching unit 21, with respect to the first direction 19-1.

The DC supply unit 9-2 may further comprise a freewheeling diode 23 connected between the first conductor 16-1 and the second conductor 16-2.

The DC supply unit 9-2 may in some variations also comprise an isolator switch unit 25, i.e. a disconnector. Thereby, the DC supply unit 9-2 and thus the power provision unit connected to the DC supply unit may be isolated from a fault on for instance the main DC bus shown in FIG. 1, or the isolator may isolate a faulty power provision unit connected to the DC supply unit 9-2.

A third example of a DC supply unit will now be described with reference to FIG. 2c. DC supply unit 9-3 comprises a first conductor 16-1, a second conductor 16-2, a first current blocking device 17, a first switching unit 21, a second switching unit 29, and another current blocking device referred to as a third current blocking device 31.

The first current blocking device 17 and the first switching unit 21 are similar to what has been described with reference to FIGS. 2a and 2b, and will therefore not be described in more detail.

The second switching unit 29 is connected in parallel with the first current blocking device 17. The second switching unit 29 may for example be a thyristor.

The third current blocking device 31, which for instance may be a diode, is connected in parallel with the second switching unit 29. The third current blocking device 31 is arranged to allow current to flow in the second direction 19-2 through the third current blocking device 31, and to block current that flows in the first direction 19-1.

The second switching unit 29 is arranged in parallel with the third current blocking device 31 in such a way that current flowing in the first direction 19-1 bypasses the third current blocking device 31.

The design of the DC supply unit 9-3 allows for current to flow through the second switching unit 29 in the first direction 19-1 during normal operation. If the current direction is reversed during normal operation, e.g. due to motor breaking, the third current blocking device 31 will allow current to flow through it, and the first switching unit 21 is controlled to be in its open state, whereby the current is allowed to flow through the DC supply unit 9-3. In the case of a fault in the DC supply network, during which current flow is reversed such that it flows in the second direction, the second switch unit 29 blocks the current, as does the first current blocking device 17, and the first switching unit 21 is set to its off state. Thereby, currents are blocked from flowing from the power provision unit, which may be connected to the DC supply unit 9-3, to the fault.

The DC supply unit 9-3 may further comprise a freewheeling diode 23 connected between the first conductor 16-1 and the second conductor 16-2.

The DC supply unit 9-3 may in some variations also comprise an isolator switch unit 25, i.e. a disconnector. Thereby, the DC supply unit 9-3 and thus the power provision unit connected to the DC supply unit may be isolated from a fault on for instance the main DC bus shown in FIG. 1, or the isolator may isolate a faulty power provision unit connected to the DC supply unit 9-3.

Figure 3A:
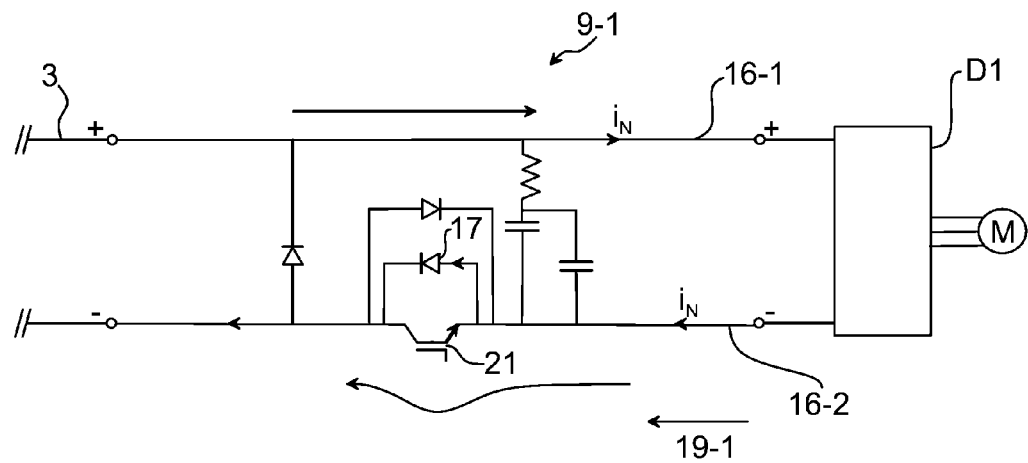
FIG. 3a shows an example of how the DC supply unit in FIG. 2a may operate under normal operating conditions.
Figure 3B:
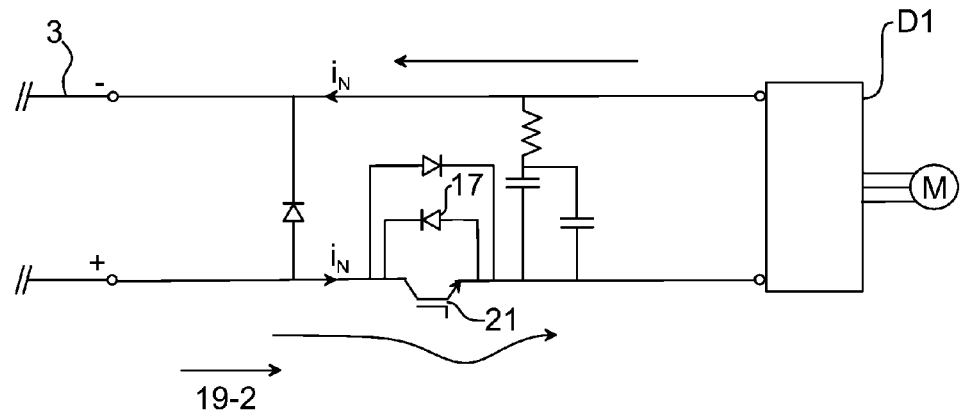
FIG. 3b shows another example of how the DC supply unit in FIG. 2a may operate under normal operating conditions.
Figure 3C:
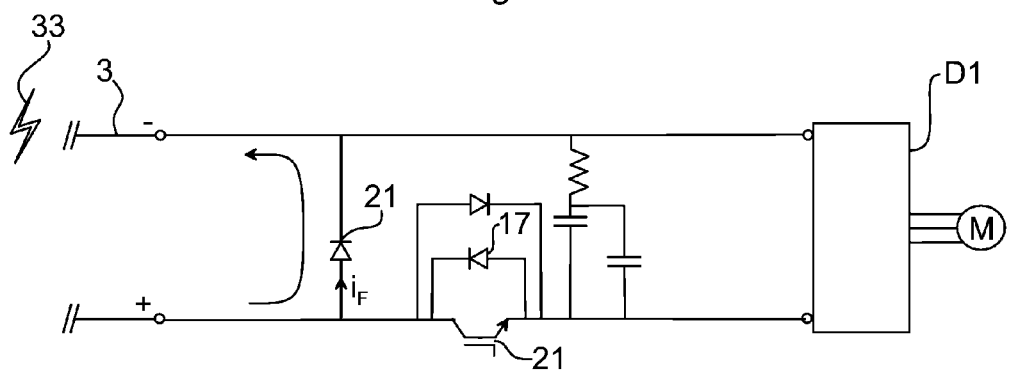
FIG. 3c shows an example of how the DC supply unit in FIG. 2a may operate under a fault condition in the DC supply network to which the DC supply network is connected.

Referring now to FIGS. 3a-c, the operation of the DC supply unit 9-1 according to the first example will now be described in some specific situations.

In FIG. 3a, the DC supply unit 9-1 is connected to the DC supply network 1 at one end, and to the first drive unit D1 at its other end. According to the example, the first drive unit D1 is arranged to power a motor M. In the example in FIG. 3a, the DC supply network 1 operates under normal operating conditions, i.e. no faults are present in the DC supply network.

Power is thus provided to the motor M via the first drive unit D1 and a current $i_N$ flows from the DC supply network 1 via the first conductor 16-1 to the first drive unit D1 and the motor M, and then back to the DC supply network 1 via the second conductor 16-2.

According to the example, the current $i_N$ flows in the first direction 19-1 in the second conductor 16-2. The current $i_N$ is thus able to flow through the first current blocking device 17 back to the DC supply network 1. Typically, the first switching unit 21 is in its on-state during normal operation.

In FIG. 3b, a situation is shown where the motor M breaks, wherein the current $i_N$ is reversed. In this case, the current flow direction in the second conductor 16-2 is in the second direction 19-2. The first switching unit 21 is controlled to be in its on state such that the current $i_N$ can flow through the first switching unit 21. Thereby current is able to flow through the DC supply unit 9-1 and through the first drive unit D1.

In FIG. 3c, a situation is shown where a short circuit fault 33 has occurred somewhere on the main DC bus of the DC supply network 1. In this case, the voltage level on the main DC bus will fall, and become lower than the voltage level at the first drive unit D1. Therefore, the current flow direction is reversed as compared to the flow direction of the normal operational state in FIG. 3a. In this situation, the first switching unit 21 is set in its off-state thereby blocking current from flowing through the first switching unit in the second direction 19-2. The first current blocking device 17 also blocks current from flowing through it. Therefore, the fault current $i_F$ will flow through the freewheeling diode 23 back to the DC supply network 1. As a result, currents drawn from capacitor banks in the first drive unit D1 can be limited, thereby hindering the protecting fuses F to blow in the first drive unit D1, as typically such fuses are intended to blow only in case of an internal fault in the first drive unit D1 or possibly in case of a fault downstream of the first drive unit D1.

Sensors are typically arranged to measure electrical parameters such as currents and voltages in the DC supply network. Based on the measured parameters, proper control can be provided to the switching unit(s) in the DC supply unit according to any example presented herein. Thus, it can be determined whether a reverse current is due to a fault, wherein the switching unit(s) is/are set in the off-state, or if the reverse current is due to normal operation, wherein the switching unit is controlled such that current can be delivered back to the DC supply network.

In addition to the current flow control provided by the DC supply units described herein, the optional isolator switch unit 25 may be used to disconnect the DC supply unit from the DC supply network, e.g. for maintenance purposes or for disconnecting a faulty power provision unit from the DC supply network.

The DC supply units described herein may for instance be used in an on-board power system for powering a vessel.

The DC supply units presented herein may typically be used in a low voltage environment, although higher voltage applications, e.g. medium voltage, are also envisaged.

The inventive concept has mainly been described above with reference to a few examples. However, as is readily appreciated by a person skilled in the art, other embodiments than the ones disclosed above are equally possible within the scope of the inventive concept, as defined by the appended claims.

What is claimed is:

1. A DC supply unit which at one end is arranged to be connected to a DC supply network and which at another end is arranged to be connected to an internal bus of a power provision unit, wherein the DC supply unit comprises:
   a first current blocking device configured so that current in a first direction flows through the first current blocking device and configured to block current that flows in a second direction opposite the first direction, and
   a first switching unit, wherein the first switching unit alone or in combination with at least one other electrical component is arranged in anti-parallel connection with the first current blocking device, wherein the first switching unit is controllable to selectively be set in an on-state such that reverse current flows through the first switching unit in the second direction so as to bypass the first current blocking device or in an off-state to block current in the second direction when a fault occurs in the DC supply network,
   wherein, in absence of a fault in the DC supply network, the first switching unit is in the on-state and reverse current in the second direction flows through the first switching unit.

2. The DC supply as claimed in claim 1, comprising a first conductor and a second conductor for connecting the DC supply unit to the DC supply network and to the power provision unit, wherein each of the first current blocking device and the first switching unit has a respective input terminal and output terminal connected to the second conductor.

3. The DC supply unit as claimed in claim 1, wherein the first current blocking device is a passive current blocking device.

4. The DC supply unit as claimed in claim 3, wherein the first current blocking device is a diode.

5. The DC supply unit as claimed in claim 2, comprising an inductor connected to the second conductor.

6. The DC supply unit as claimed in claim 1, comprising a second switching unit connected in parallel with a combination of the first current blocking device and additional electrical components.

7. The DC supply unit as claimed in claim 6, wherein the second switching unit is a thyristor.

8. The DC supply unit as claimed in claim 6, comprising a third current blocking device, wherein a combination of the third current blocking device, the first current blocking device and the first switching unit is connected in parallel with the second switching unit, wherein the third current blocking device is arranged to allow current to flow in the second direction through the third current blocking device, and wherein the third current blocking device is arranged to block current that flows in the first direction.

9. The DC supply unit as claimed in claim 8, wherein the second switching unit is arranged in parallel with said combination of the third current blocking device, the first current blocking device and the first switching unit in such a way that current flowing in the first direction bypasses the third current blocking device.

10. The DC supply unit as claimed in claim 1, wherein the first switching unit comprises an insulated gate bipolar transistor.

11. The DC supply unit as claimed in claim 1, wherein the power provision unit is a drive unit.

12. The DC supply unit as claimed in claim 1, wherein the power provision unit is an energy storage unit.

13. A power provision unit comprising:
   a DC supply unit which at one end is arranged to be connected to a DC supply network and which at another end is arranged to be connected to an internal bus of the power provision unit,
   the DC supply unit having:
      a first current blocking device configured so that current in a first direction flows through the first current blocking device and configured to block current that flows in a second direction opposite the first direction, and
      a first switching unit, wherein the first switching unit alone or in combination with at least one other electrical component is arranged in anti-parallel connection with the first current blocking device, wherein the first switching unit is controllable to selectively be set in an on-state such that reverse current flows through the first switching unit in the second direction so as to bypass the first current blocking device or in an off-state to block current in the second direction when a fault occurs in the DC supply network,
   wherein, in absence of a fault in the DC supply network, the first switching unit is in the on-state and reverse current in the second direction flows through the first switching unit.

14. A DC supply unit which at one end is arranged to be connected to a DC supply network and which at another end is arranged to be connected to an internal bus of a power provision unit, wherein the DC supply unit comprises:
   a first current blocking device arranged to allow current to flow in a first direction through the first current blocking device, which first direction is the flow direction of current during normal operation of the DC supply network, and to block current that flows in a second direction opposite the first direction, and
   a first switching unit, wherein the first switching unit alone or in combination with at least one other electrical component is arranged in anti-parallel connection with the first current blocking device, wherein the first switching unit is controllable to selectively be set in an on-state during normal operation of the DC supply network to allow reverse current to flow through the first switching unit in the second direction so as to bypass the first current blocking device or in an off-state to block current in the second direction when a fault occurs in the DC supply network,
   a first conductor and a second conductor for connecting the DC supply unit to the DC supply network and to the power provision unit, wherein each of the first current blocking device and the first switching unit has a respective input terminal and output terminal connected to the second conductor,
   an inductor connected to the second conductor,
   wherein the first current blocking device is connected in parallel with a combination of the first switching unit and the inductor in such a way that current flowing in the first direction bypasses the inductor.

15. The DC supply as claimed in claim 1, wherein in the absence of a fault in the DC supply network, the first switching unit is in the on-state and current in the first direction flows through the first current blocking device.

16. The power provision unit as claimed in claim 13, wherein in the absence of a fault in the DC supply network, the first switching unit is in the on-state and current in the first direction flows through the first current blocking device.

* * * * *